(12) United States Patent
Raga-Barone

(10) Patent No.: US 11,658,053 B2
(45) Date of Patent: May 23, 2023

(54) CONVERSION PLATE FOR RETICLE POD STORAGE AND A RETICLE POD STORAGE SYSTEM

(71) Applicant: GLOBALFOUNDRIES U.S. Inc., Santa Clara, CA (US)

(72) Inventor: Michael Raga-Barone, Ballston Spa, NY (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 735 days.

(21) Appl. No.: 16/659,090

(22) Filed: Oct. 21, 2019

(65) Prior Publication Data

US 2021/0118714 A1    Apr. 22, 2021

(51) Int. Cl.
*H01L 21/677* (2006.01)
*G03F 7/20* (2006.01)

(52) U.S. Cl.
CPC .... *H01L 21/67769* (2013.01); *G03F 7/70741* (2013.01); *H01L 21/67775* (2013.01)

(58) Field of Classification Search
CPC .......................... G03F 7/70716; G03F 7/70741
See application file for complete search history.

(56) References Cited

U.S. PATENT DOCUMENTS

| | | | |
|---|---|---|---|
| 5,092,557 A * | 3/1992 | Sawatzki | .......... H01L 21/67775 414/757 |
| 5,980,183 A | 11/1999 | Fosnight | |
| 6,432,849 B1 * | 8/2002 | Endo | .................... H01L 21/6732 206/710 |
| 6,530,736 B2 | 3/2003 | Rosenquist | |
| 7,578,240 B2 | 8/2009 | Shiwaku | |
| 7,887,277 B2 | 2/2011 | Campbell et al. | |
| 7,972,104 B2 | 7/2011 | Shiwaku et al. | |
| 8,821,099 B2 | 9/2014 | Hall et al. | |
| 10,304,712 B2 | 5/2019 | Ito | |
| 2003/0046998 A1 * | 3/2003 | Seita | ................. H01L 21/67259 73/431 |
| 2006/0051188 A1 | 3/2006 | Hosino | |
| 2008/0056864 A1 | 3/2008 | Wada et al. | |
| 2012/0067770 A1 * | 3/2012 | Hatano | ............. H01L 21/67379 206/710 |
| 2016/0001976 A1 * | 1/2016 | Nagamine | ................ B65G 1/02 211/134 |
| 2017/0243776 A1 * | 8/2017 | Murata | ............. H01L 21/67769 |

* cited by examiner

*Primary Examiner* — Glenn F Myers
(74) *Attorney, Agent, or Firm* — Francois Pagette; Hoffman Warnick LLC

(57) ABSTRACT

One illustrative device disclosed herein includes a FOUP (Front Opening Unified Pod) storage bin, a plurality of pins positioned on a first surface of the FOUP storage bin, wherein the plurality of pins are adapted to engage and register with the FOUP, and a conversion plate. In one illustrative embodiment, the conversion plate includes a plate with a front surface and a back surface, a reticle pod receiving structure on the front surface that at least partially bounds a reticle pod receiving area on the front surface, and a pin engagement structure on the back side that is adapted to engage the plurality of pins on the first surface of the FOUP storage bin.

14 Claims, 15 Drawing Sheets

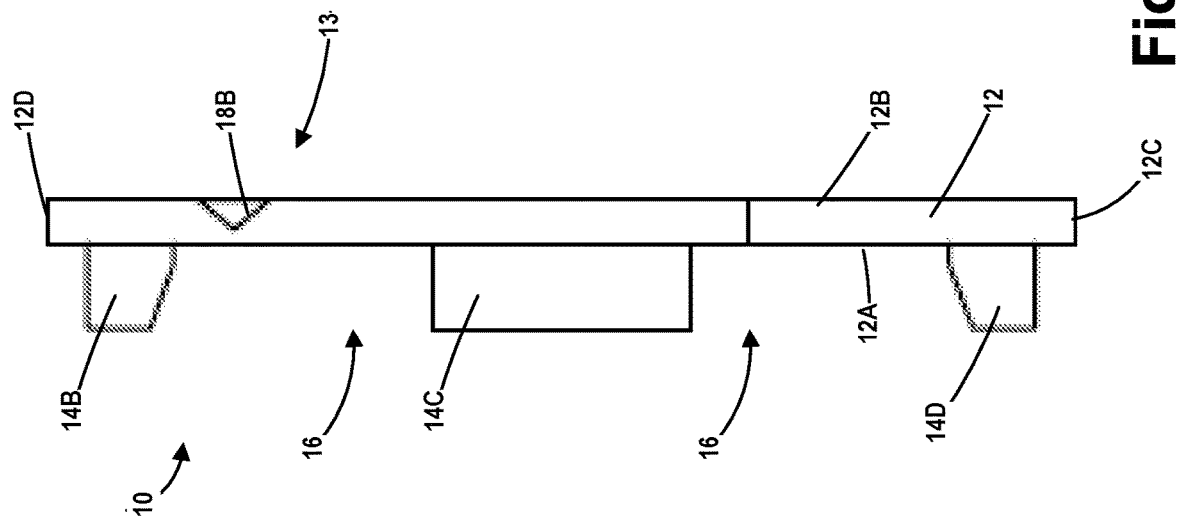
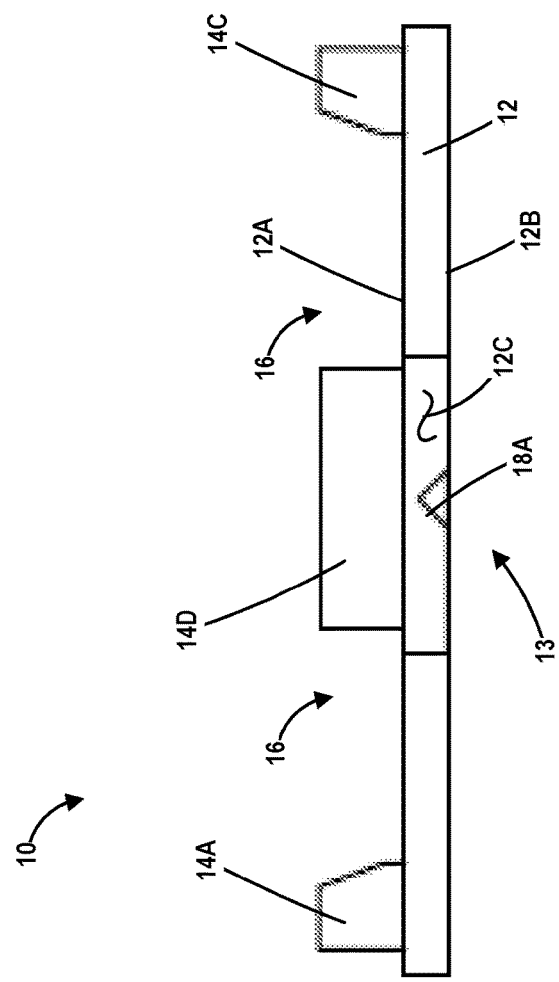

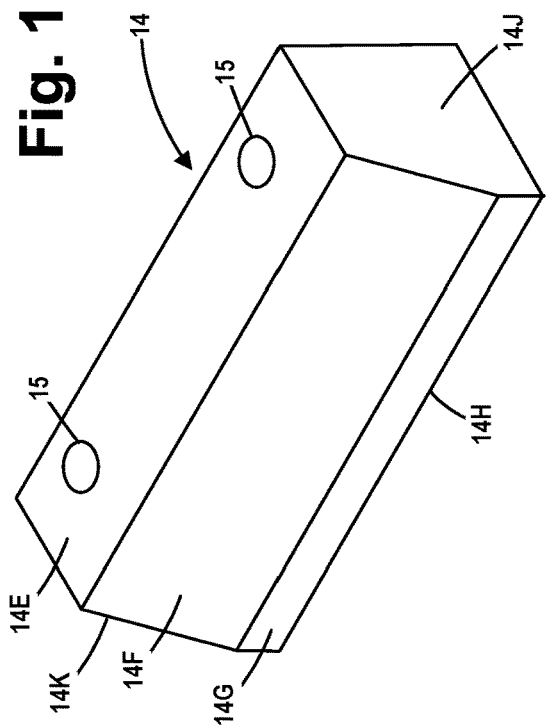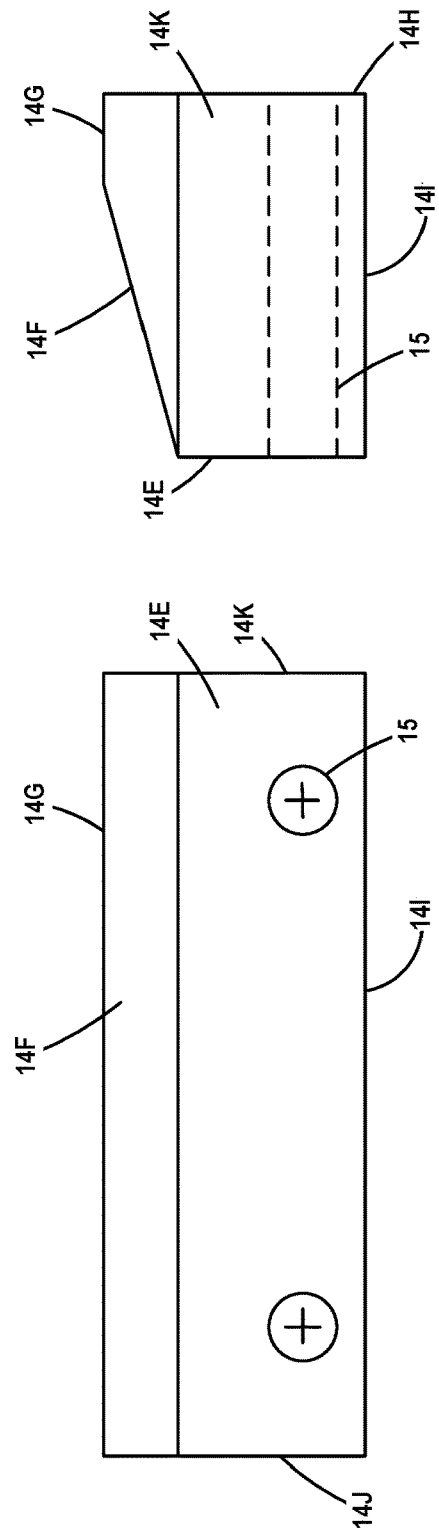

CONVERSION PLATE FOR RETICLE POD STORAGE AND A RETICLE POD STORAGE SYSTEM

BACKGROUND

Field of the Invention

The present disclosure generally relates to various embodiments of a novel conversion plate for reticle pod storage and a novel reticle pod storage system.

Description of the Related Art

Reticles are used in manufacturing integrated circuit products. A reticle contains a pattern that is desired to be formed on a semiconductor substrate (or wafer) where the integrated circuits are formed. A typical reticle comprises a quartz plate with the pattern defined in a thin layer of chrome on one side of the reticle. Photolithography tools and techniques are used to project the image on the reticle onto the surface of a layer of photoresist material that is formed on the surface of the wafer. Thereafter, the layer of photoresist material is developed so as to produce a patterned mask layer that contains the image on the reticle. Reticles are expensive to manufacture and must be handled with care so as to not damage the pattern defined in the reticle.

Reticles must also be safely stored when not in use and readily retrievable when needed. Typically, a single reticle is stored in a protective reticle pod. In some cases, a plurality of reticle pods (each having a reticle therein) are stored in a tool generally known as a reticle stocker. The size of such reticle stockers may vary, but, in some cases, a reticle stocker may hold several hundred, e.g., 700-800, reticle pods. Another technique used for storing reticles involves removing the reticle from each reticle pod and storing the reticles and the reticle pods (each without a reticle therein) in separate locations. This type of storage system is something referred to as bare reticle stocker. In such bare reticle stocker systems, the number of stored reticles may be quite high, e.g., 1500-2000 individually stored reticles. However, irrespective of the techniques and systems used for reticle storage, the existing systems consume valuable floor space within the clean rooms where integrated circuit products are fabricated.

The present disclosure is generally directed to various embodiments of a novel conversion plate for reticle pod storage and a novel reticle pod storage system that may solve or at least reduce one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of a novel conversion plate for reticle pod storage and a novel reticle pod storage system. One illustrative device disclosed herein includes a plate with a front surface and a back surface, a reticle pod receiving structure positioned on the front surface, wherein the reticle pod receiving structure at least partially bounds a reticle pod receiving area on the front surface and wherein the back surface has a pin engagement structure that is adapted to engage a plurality of pins.

Another illustrative device disclosed herein includes a plate that includes a front surface and a back surface, a plurality of individual reticle pod receiving guides positioned on the front surface, wherein the plurality of individual reticle pod receiving guides at least partially bound a reticle pod receiving area on the front surface and wherein the back surface has a plurality of channels on the back surface each of which is adapted to engage a SEMI standard load port pin.

Yet another illustrative device disclosed herein means positioned on a first surface of the FOUP storage bin for registering with a FOUP and a conversion plate. In this example, the conversion plate comprises a plate having a front surface includes a plate having a front surface, a back surface, a first edge surface, a second edge surface and a third edge surface. In this example, the device also includes a plurality of individual reticle pod receiving guides that at least partially bound a reticle pod receiving area on the front surface, and the back surface has a first channel, a second channel and a third channel, wherein each of the first channel, the second channel and the third channel is adapted to engage a SEMI standard load port pin and wherein the first channel intersects the first edge surface, the second channel intersects the second edge surface and the third channel intersects the third edge surface.

BRIEF DESCRIPTION OF THE DRAWINGS

The disclosure may be understood by reference to the following description taken in conjunction with the accompanying drawings (which are not to scale), in which like reference numerals identify like elements, and in which:

FIG. 5 is a front view of one illustrative embodiment of a novel conversion plate for reticle pod storage disclosed herein;

FIG. 6 is a side view of one illustrative embodiment of a novel conversion plate for reticle pod storage disclosed herein;

FIG. 13 is a perspective view of one illustrative embodiment of a reticle pod guide structure employed on one illustrative embodiment of a novel conversion plate for reticle pod storage disclosed herein;

FIG. 14 is a top view of one illustrative embodiment of a reticle pod guide structure employed on one illustrative embodiment of a novel conversion plate for reticle pod storage disclosed herein;

FIG. 15 is a side view of one illustrative embodiment of a reticle pod guide structure employed on one illustrative embodiment of a novel conversion plate for reticle pod storage disclosed herein;

Figure 1:
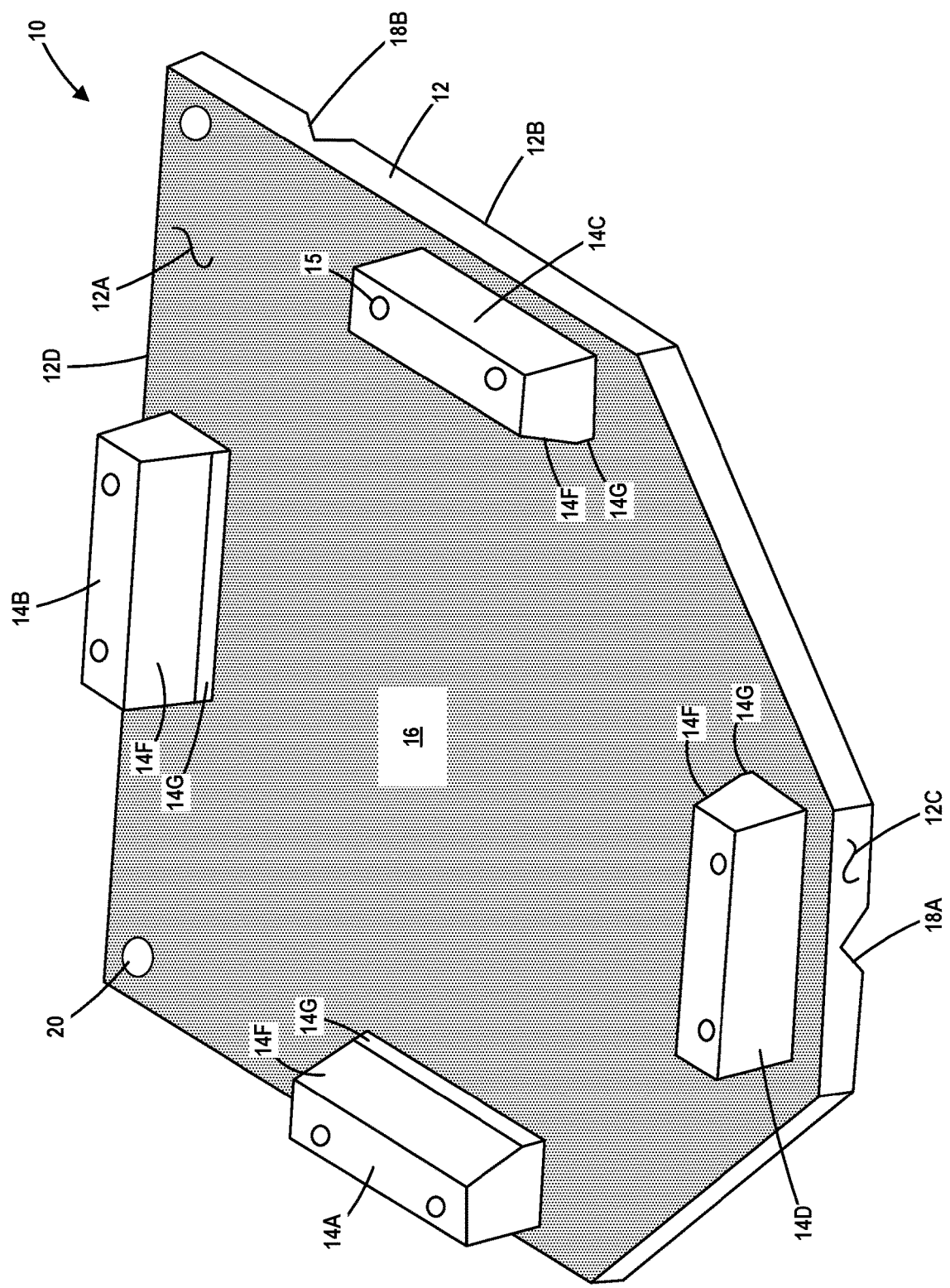
FIG. 1 is a top perspective view of one illustrative embodiment of a novel conversion plate for reticle pod storage disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. With reference to the attached figures, various illustrative embodiments of the devices, systems and methods disclosed herein will now be described in more detail.

Figure 2:
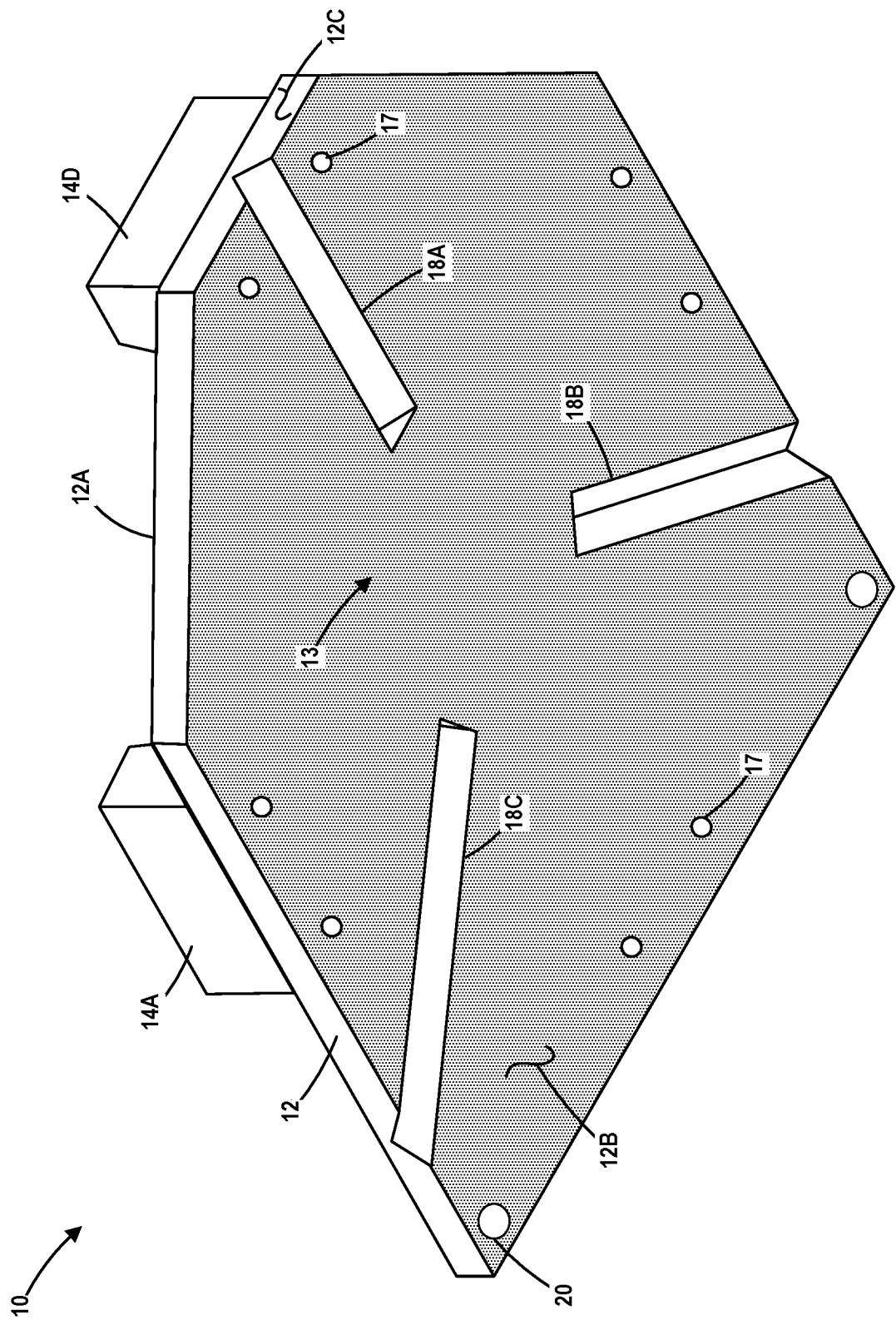
FIG. 2 is a bottom perspective view of one illustrative embodiment of a novel conversion plate for reticle pod storage disclosed herein.
Figure 3:
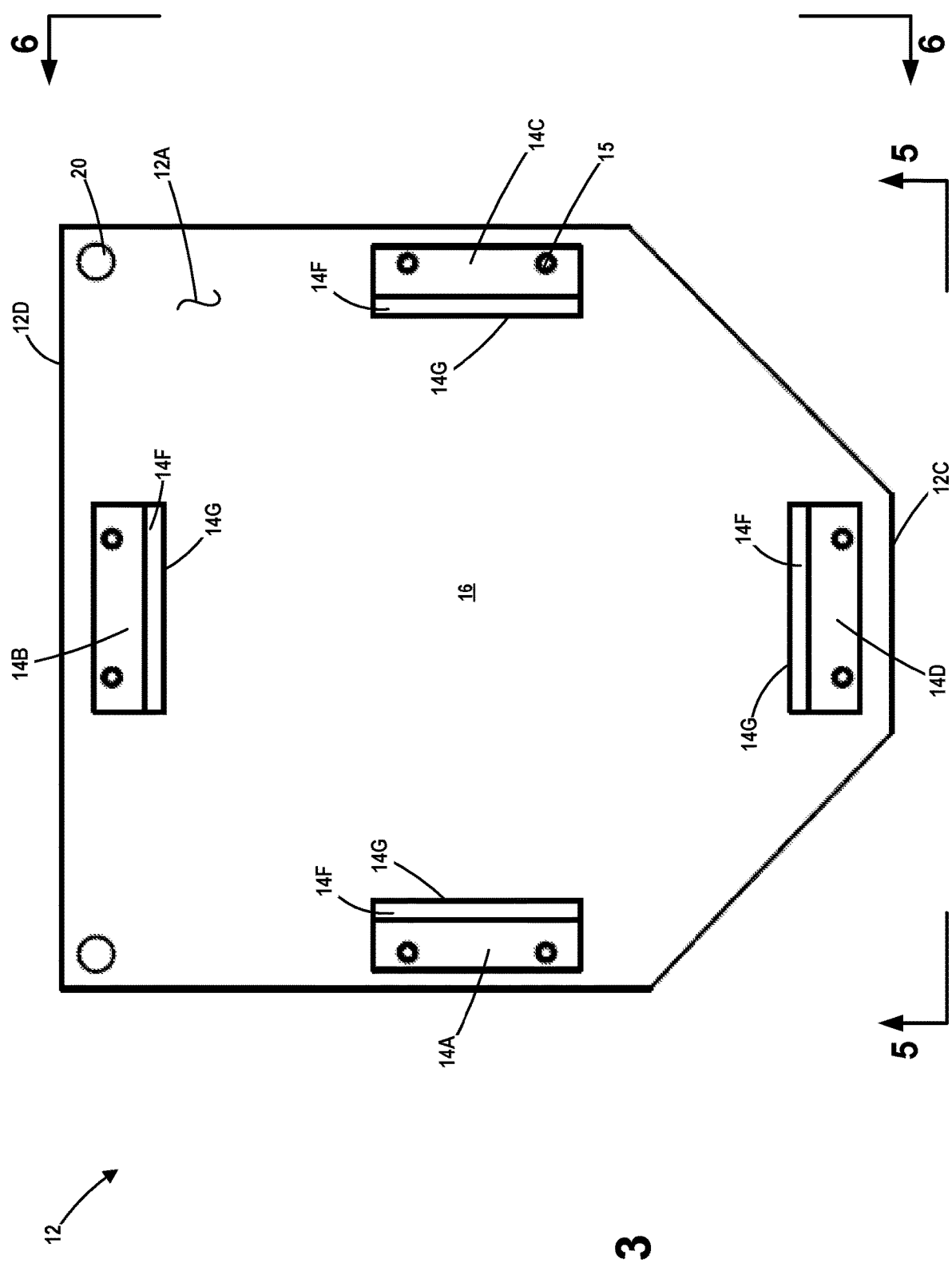
FIG. 3 is a top view of one illustrative embodiment of a novel conversion plate for reticle pod storage disclosed herein.

FIGS. 1-20 depict various views of various embodiments of a novel conversion plate for reticle pod storage, a novel reticle pod storage system and various novel methods of storing reticle pods. FIGS. 1 and 2 are, respectively, top and bottom perspective views of one illustrative embodiment of a novel conversion plate 10 for reticle pod storage disclosed herein.

In the depicted example, the conversion plate 10 comprises a plate 12 and a plurality of reticle pod receiving guides 14A-D (collectively referenced using the numeral 14) that are secured to a front side 12A of the plate 12 by a plurality of threaded fasteners that extend through a plurality of openings 15 that extend through the reticle pod receiving guides 14 and a plurality of openings 17 that extend through the plate 12 (see FIG. 2). The plate 12 further comprises a back surface 12B, a front edge 12C and a back edge 12D. Collectively, the reticle pod receiving guides 14 define a reticle pod receiving area 16 on the front surface 12A of the plate 12. In general, the reticle pod receiving guides 14, considered collectively, constitute a means for receiving a reticle pod in a reticle pod receiving structure 16 on the front surface 12A of the plate 12. The plate 12 may be of any desired shape or configuration (when viewed from above) and it may be made of any material, e.g., aluminum, steel, plastic, etc. The thickness of the plate 12 may also vary depending upon the particular application. In the depicted example, a plurality of optional holes 20 are formed in the plate 12 to provide a means to secure the plate 12 in position in the event of an unusual event, e.g., an earthquake. If desired, the plate 12 may be secured to another structure (not shown) by various means, e.g., zip ties, wire, bolting, etc.

As best seen in FIGS. 13-15, the illustrative reticle pod receiving guides 14 disclosed herein comprise a top surface 14E, a tapered front surface 14F, a vertical front surface 14G, a bottom surface 14H, a back surface 14I and end surfaces 14J, 14K. In the depicted example, the reticle pod receiving guides 14 are mounted on the plate 12 such that the tapered front surface 14F of each of the reticle pod receiving guides 14 faces inward toward the reticle pod receiving area 16. As depicted, the individual reticle pod receiving guides 14 shown in the drawings do not connect with one another.

Of course, as will be appreciated by those skilled in the art after a complete reading of the present application, the four illustrative reticle pod receiving guides 14 are only one possible arrangement of a means for receiving a reticle pod in a reticle pod receiving structure 16 on the front surface 12A of the plate 12. In other embodiments, less than four of the reticle pod receiving guides 14 may be provided, e.g., the conversion plate 10 may comprise only three of the reticle pod receiving guides 14. In the depicted example, the reticle pod receiving guides 14 are individual structures that are removably coupled to the plate 12. In other applications, the reticle pod receiving guides 14 may be formed integral with the plate 12, e.g., by machining the reticle pod receiving guides 14 into the material of the plate 12 or by casting the reticle pod receiving guides 14 and the plate 12 as a single body of material. In yet other applications, the individual reticle pod receiving guides 14 may be attached to the plate 12 by welding or gluing them into position on the plate 12. Additionally, in yet other embodiments, the individual reticle pod receiving guides 14 may be replaced with a continuous ring of material, e.g., a rectangular-shape ring of material, that completely bounds the reticle pod receiving area 16. Such a continuous reticle pod receiving ring may be permanently or removably coupled to the plate 12, or it may be formed integral with the plate 12, and it may comprise a tapered surface 14F that faces the reticle pod receiving area 16. The reticle pod receiving guides 14 may be of any desired shape or configuration (when viewed from above) and they may be made of any material, e.g., aluminum, steel, plastic, etc. The vertical thickness or height of the reticle pod receiving guides 14 may also vary depending upon the particular application. Moreover, the reticle pod receiving guides 14 and the plate 12 need not be made of the same material, but that may be the case in some applications. In another embodiment, the individual reticle pod receiving guides 14 may be positioned to one or more adjustable slides to allow for adjustable positioning of the reticle pod receiving guides 14 so as to adjust the size of the reticle pod receiving area 16. In some embodiments, the reticle pod receiving guides 14 may even be omitted entirely or raised surfaces (not shown) formed in or on the upper surface 12A of the plate 12 may be provided to serve the functions of the reticle pod receiving guides 14 and/or to prevent the reticle pod from sliding off of the plate 12.

The reticle pod receiving area 16 may be sized and configured to receive a reticle pod of any size or configuration. For example, the reticle pod receiving area 16 may be sized and configured to receive, for example, 150 mm SMIF (Standard Mechanical InterFace), 200 mm SMIF, EUV reticle pods, etc. In one illustrative embodiment where the reticle pod receiving guides 14 are removably coupled to the plate 12, additional mounting holes 17 (see FIG. 2) may be formed in the plate 12 to allow for positioning the reticle pod receiving guides 14 at different locations such that the reticle pod receiving area 16 is properly sized to receive a reticle pod having a specific size and/or configuration.

Figure 4:
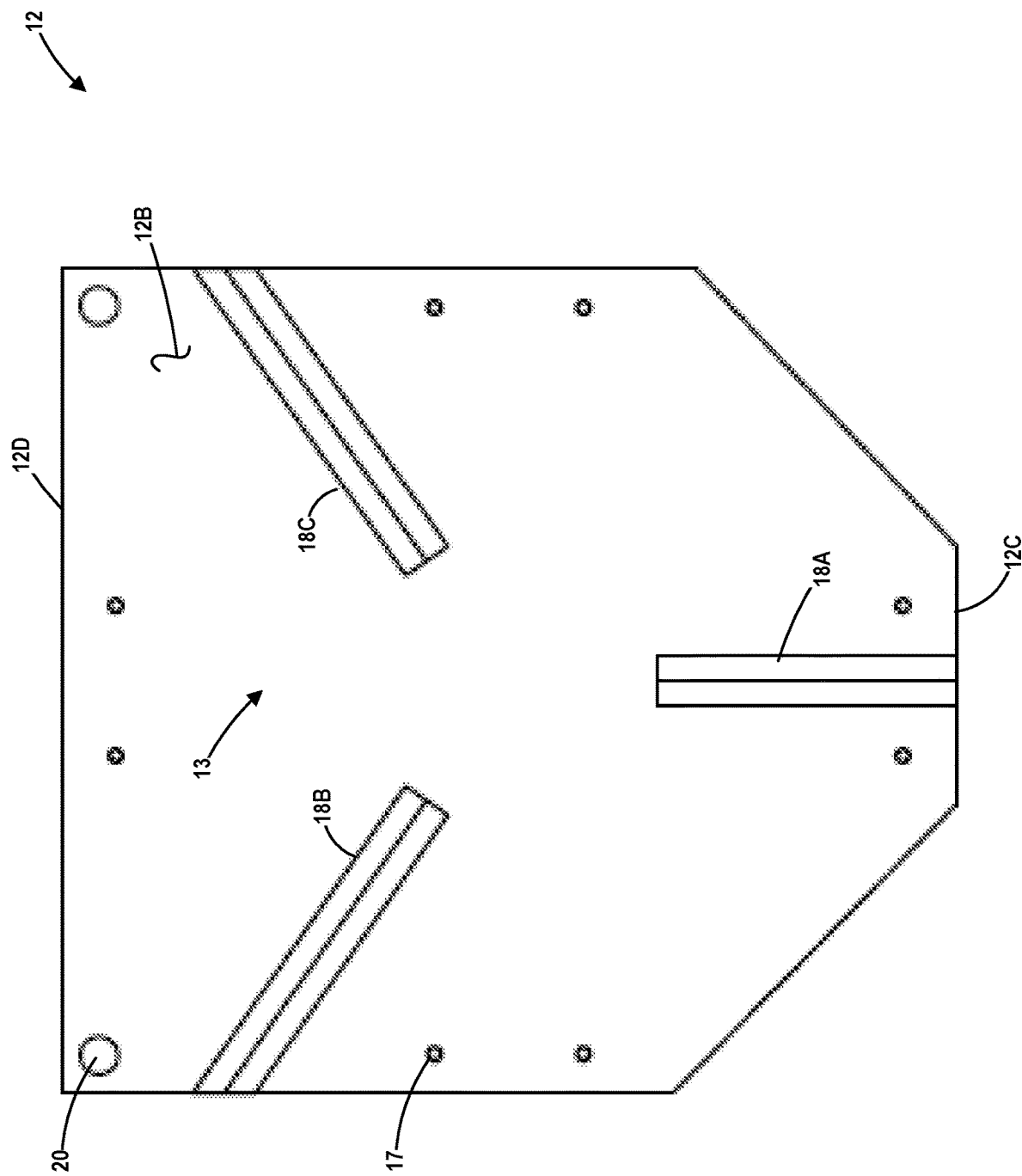
FIG. 4 is a bottom view of one illustrative embodiment of a novel conversion plate for reticle pod storage disclosed herein.
Figure 7:
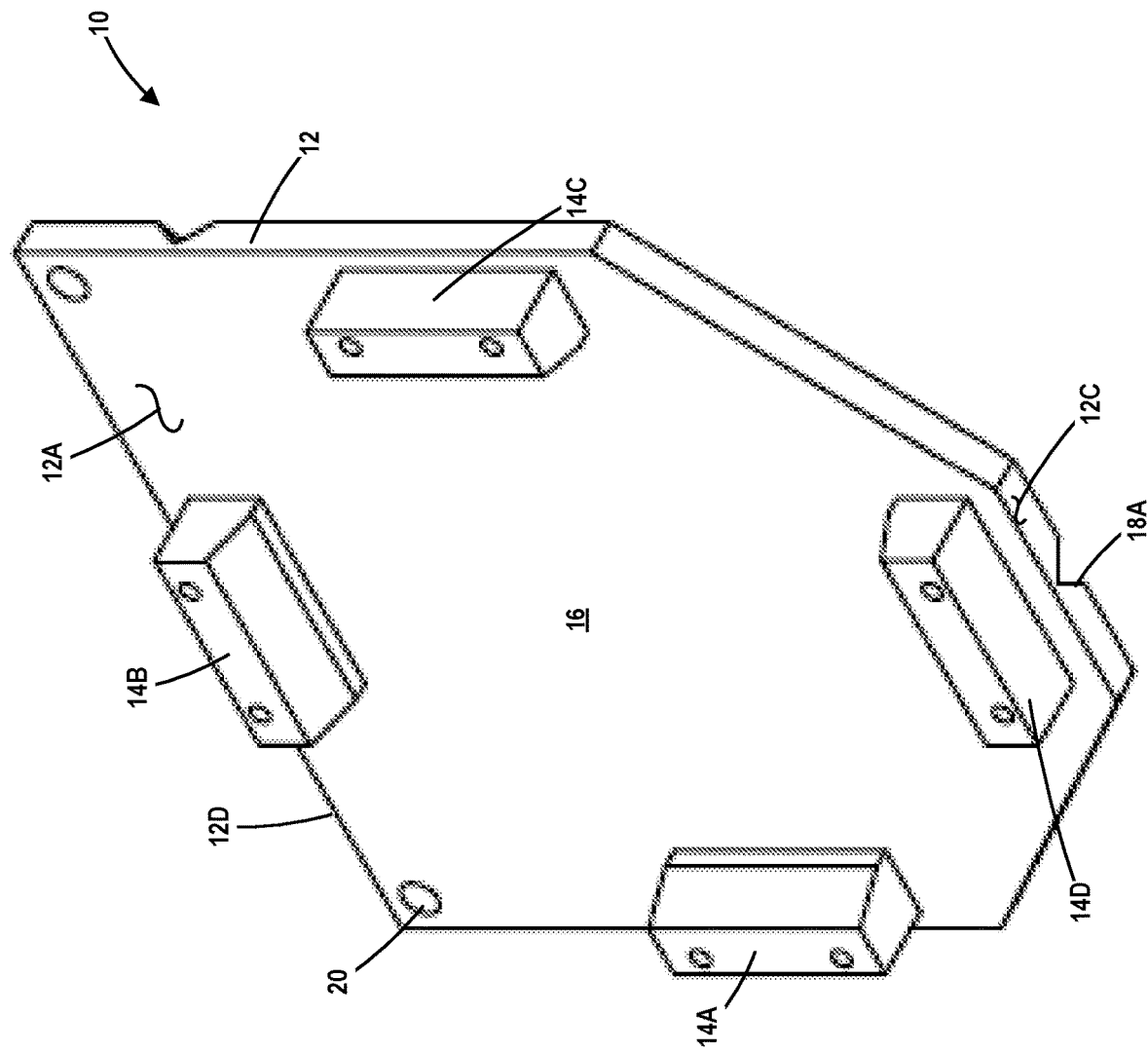
FIG. 7 is another top perspective view of one illustrative embodiment of a novel conversion plate for reticle pod storage disclosed herein.
Figure 8:
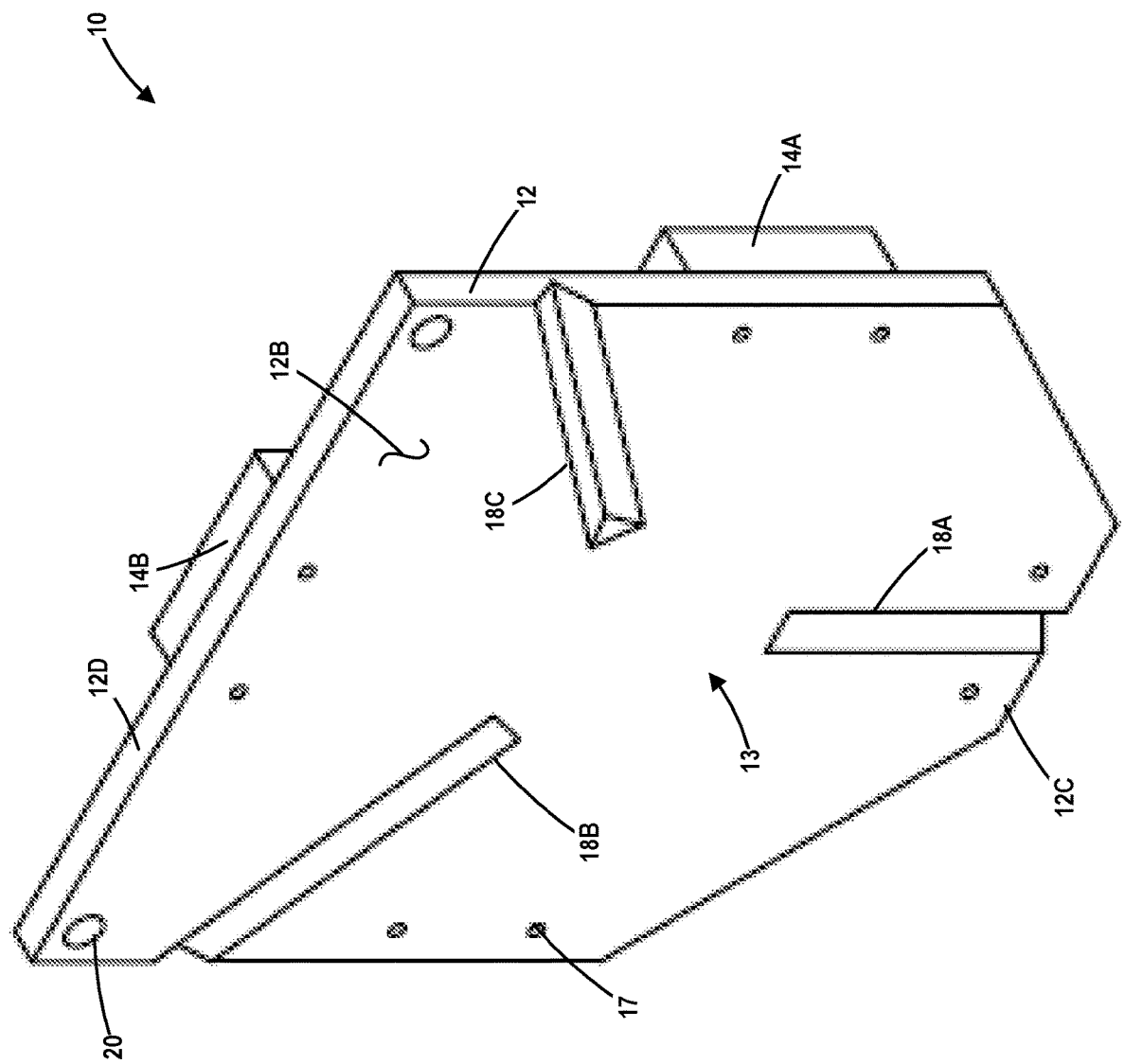
FIG. 8 is another bottom perspective view of one illustrative embodiment of a novel conversion plate for reticle pod storage disclosed herein.
Figure 9:
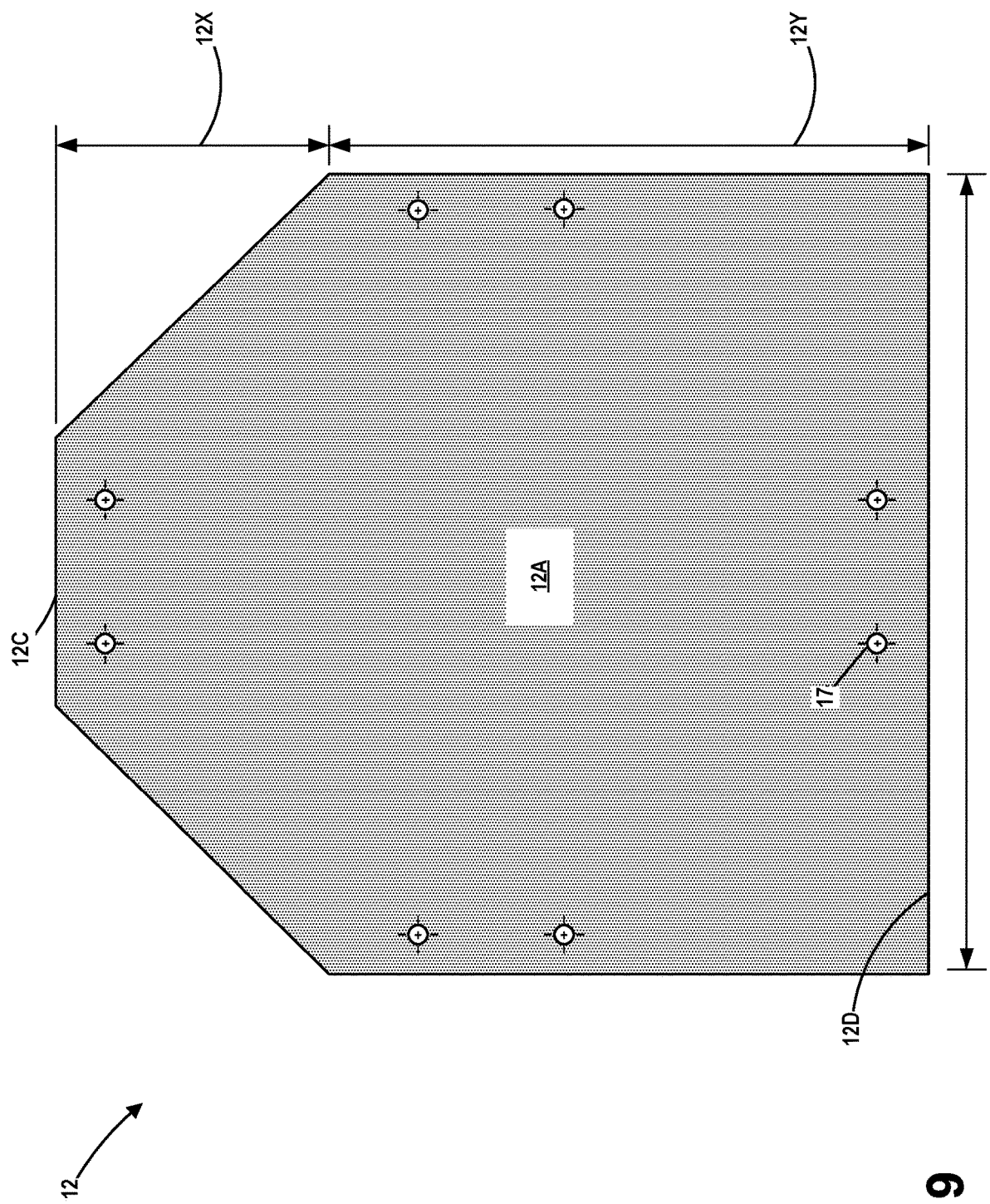
FIG. 9 is a view of a top surface of a plate portion of one illustrative embodiment of a novel conversion plate for reticle pod storage disclosed herein.

With reference to FIGS. 2 and 4, a pin engagement structure 13 is formed in the bottom 12B of the plate 12. The pin engagement structure 13 is adapted to engage with a plurality of pins 32A-C (collectively referenced using the numeral 32)—see FIG. 16—that are positioned on the upper surface 30A of an illustrative FOUP storage bin 30 when the conversion plate 10 is positioned on the FOUP storage bin 30. Such storage bins 30 are commonly found in existing Zero Footprint Storage systems used in semiconductor fabrication facilities. In one illustrative embodiment, the pins 32 may be SEMI standard (E57) load port pins. The pins 32 on the upper or front surface 30A of the FOUP storage bin 30 constitute a means for engaging and registering with a FOUP.

The pin engagement structure 13 on the back side 12B of the plate 12 is, in effect, a means for engaging the pins 32 positioned on the front surface 30A of the FOUP storage bin 30. In the depicted example, the pin engagement structure 13 takes the form of a plurality of channels 18A-C (collectively referenced using the numeral 18) that are formed in the back surface 12B of the plate 12. Each of the channels 18 are adapted to engage and register with one of the pins 32 when the conversion plate 10 is positioned on the FOUP storage bin 30.

Figure 12:
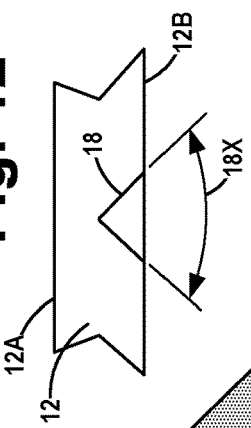
FIG. 12 is a side view of a portion of a plate portion of one illustrative embodiment of a novel conversion plate for reticle pod storage disclosed herein.
Figure 10:
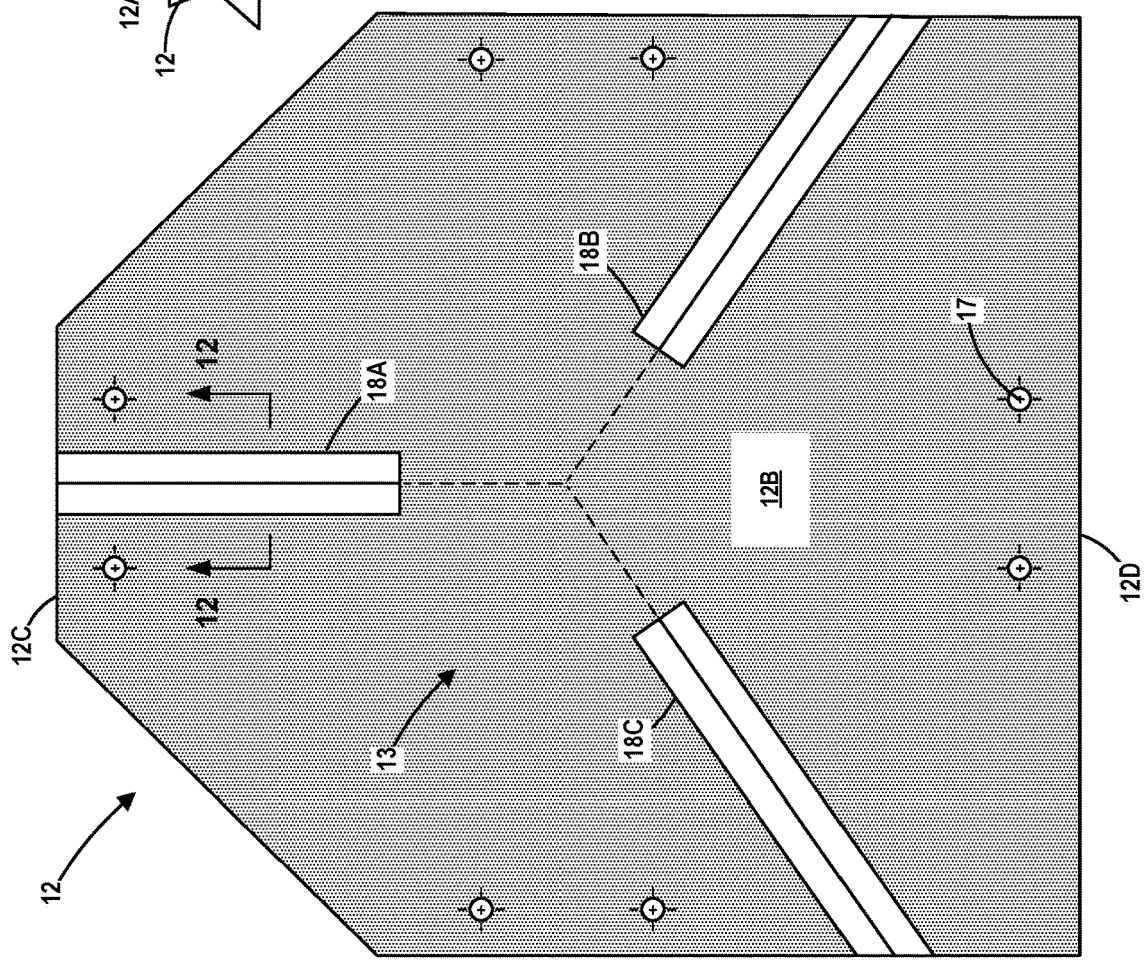
FIG. 10 is a view of a bottom surface of a plate portion of one illustrative embodiment of a novel conversion plate for reticle pod storage disclosed herein.
Figure 11:
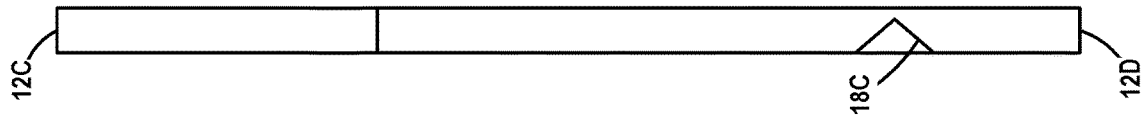
FIG. 11 is a side view of a plate portion of one illustrative embodiment of a novel conversion plate for reticle pod storage disclosed herein.
Figure 16:
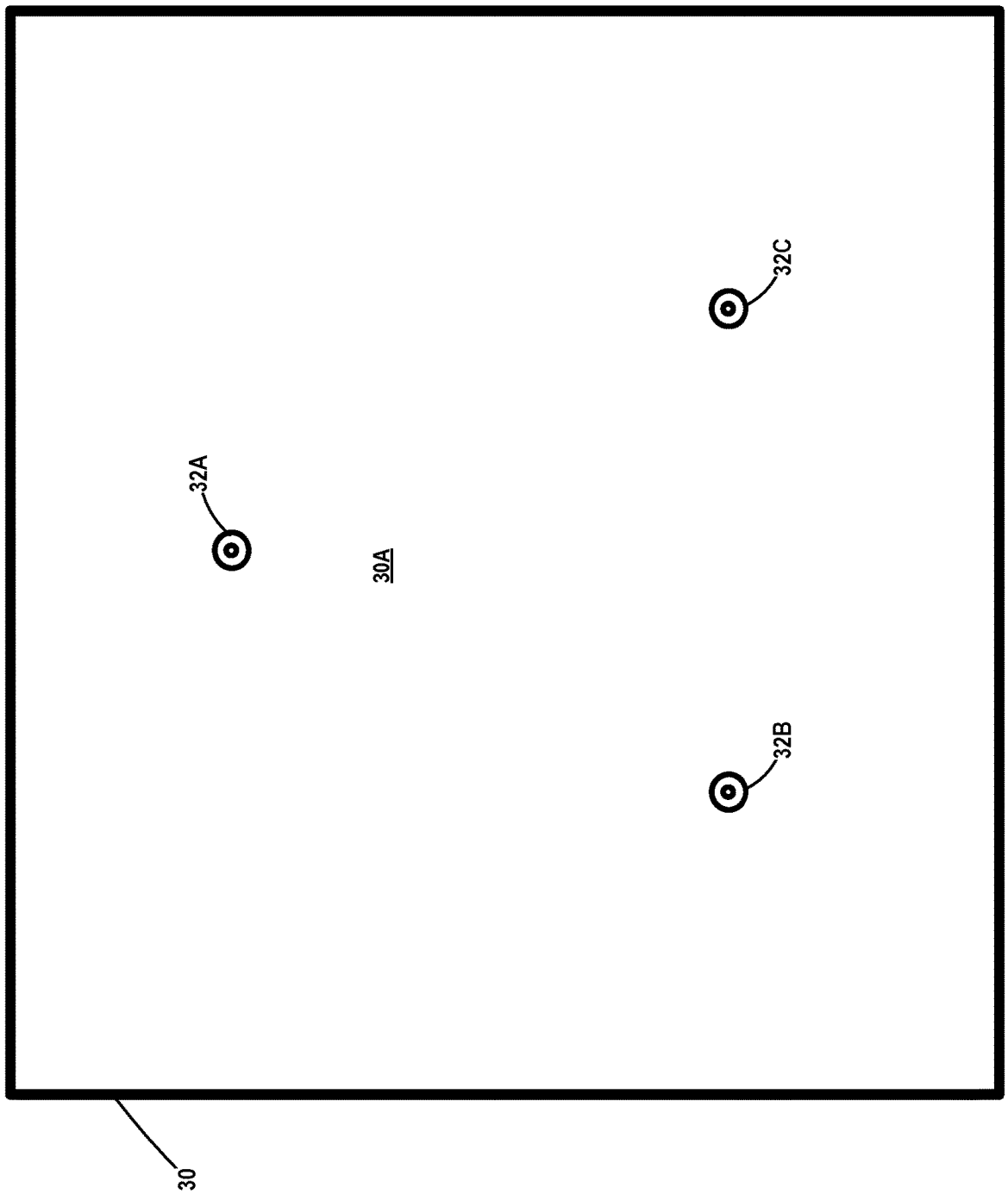
FIG. 16 is a top view of one illustrative embodiment of a FOUP (Front Opening Unified Pod) storage bin that may be employed with one illustrative embodiment of a novel conversion plate for reticle pod storage disclosed herein.

The pin engagement structures 13 (e.g., the channels 18) are sized, positioned and configured so engage and register with the pattern of the pins 32 on any size FOUP storage bin 30. For example, the channels 18 may be adapted to engage the pins 32 on the FOUP storage bins 30 that are adapted to engage any size FOUP, e.g., the FOUP may be sized and adapted to carry wafers of any size, e.g., 150 mm (or less), 200 mm, 300 mm, 450 mm, etc. The number and positioning of the channels 18 in the bottom surface 12B may vary depending upon the particular application. In the depicted example, the channels 18 are separate from one another although that may not be the case in all applications. FIG. 12 depicts one possible configuration for the channels 18. Of course, the presently disclosed subject matter should not be considered to be limited to uses where the via interaction between the pin engagement structure 13 and the plurality of SEMI standard load port pins 32, as other possible means of engagement and registration between the two structures may be employed.

Figure 17:
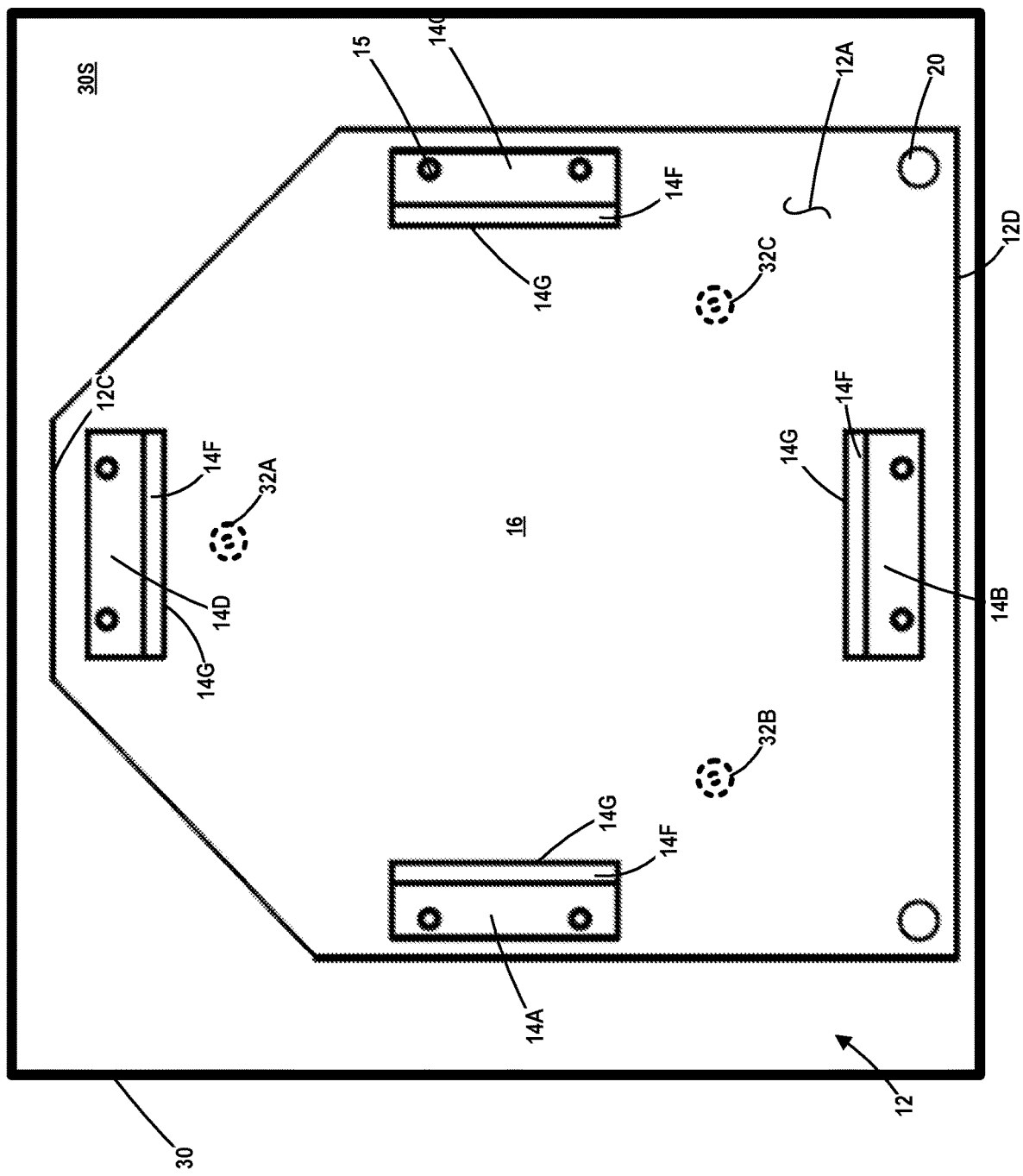
FIG. 17 is a top view showing one illustrative embodiment of a novel conversion plate for reticle pod storage disclosed herein positioned on the FOUP storage bin shown in FIG. 16.
Figure 18:
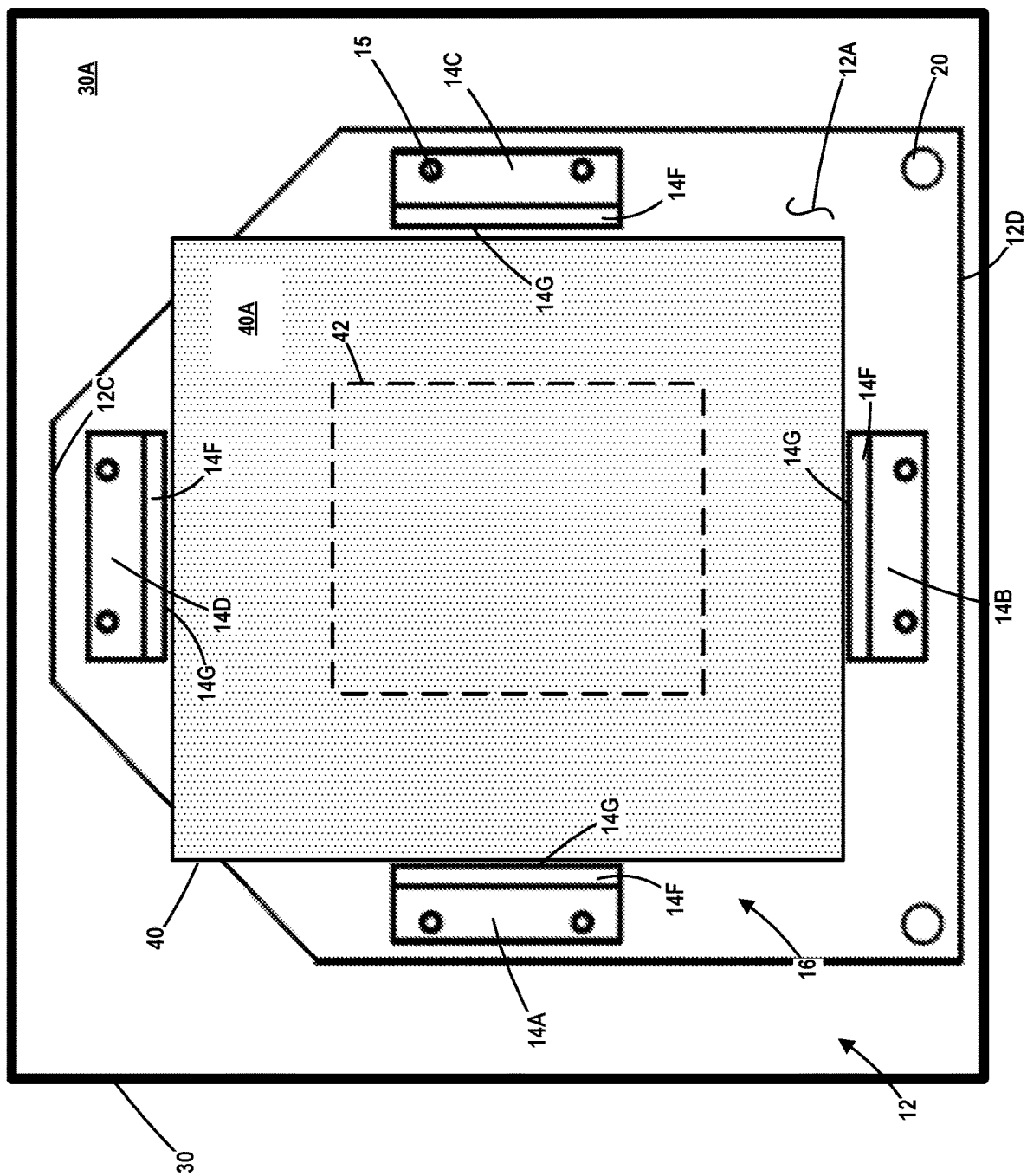
FIG. 18 is a top view showing one illustrative embodiment of reticle pod positioned in the novel conversion plate for reticle pod storage shown in FIG. 17.

As noted above, FIG. 16 is a top view of one illustrative embodiment of a FOUP storage bin 30 with a plurality of SEMI standard load port pins 32A-C formed in the upper surface 30A of the FOUP storage bin 30. As shown in FIG. 17, one illustrative embodiment of a novel conversion plate 10 has been positioned on the FOUP storage bin 30. In the situation shown in FIG. 17, the pin engagement structure 13 (e.g., the channels 18) have engaged and registered with the plurality of SEMI standard load port pins 32 on the FOUP storage bin 30. This engagement fixes the position of the conversion plate 10 relative to the FOUP storage bin 30. FIG. 18 shows one illustrative embodiment of reticle pod 40, with a top surface 40A, positioned in the reticle pod receiving area 16 of one illustrative embodiment of a novel conversion plate 10 disclosed herein. This is the final storage position for the reticle pod 40. Also depicted in FIG. 18 is a dashed-line outline 42 of an illustrative reticle that may be positioned with the reticle storage pod 40 in some cases. However, as will be appreciated by those skilled in the art after a complete reading of the present application, the reticle storage pod 40 may or may not have a reticle 42 positioned therein when the reticle storage pod 40 is positioned in the reticle pod receiving area 16. For example, the novel embodiments of the conversion plate 10 disclosed herein may be employed in fabrication facilities that employ a bare reticle stocker (as described in the background second to the present application) to store only bare reticles, wherein empty reticle storage pods may be stored using the various novel embodiments of the conversion plate 10 disclosed herein. The novel embodiments of the conversion plate 10 disclosed herein may also be used in a FOUP stocker (as described in the background section of this application).

Figure 19:
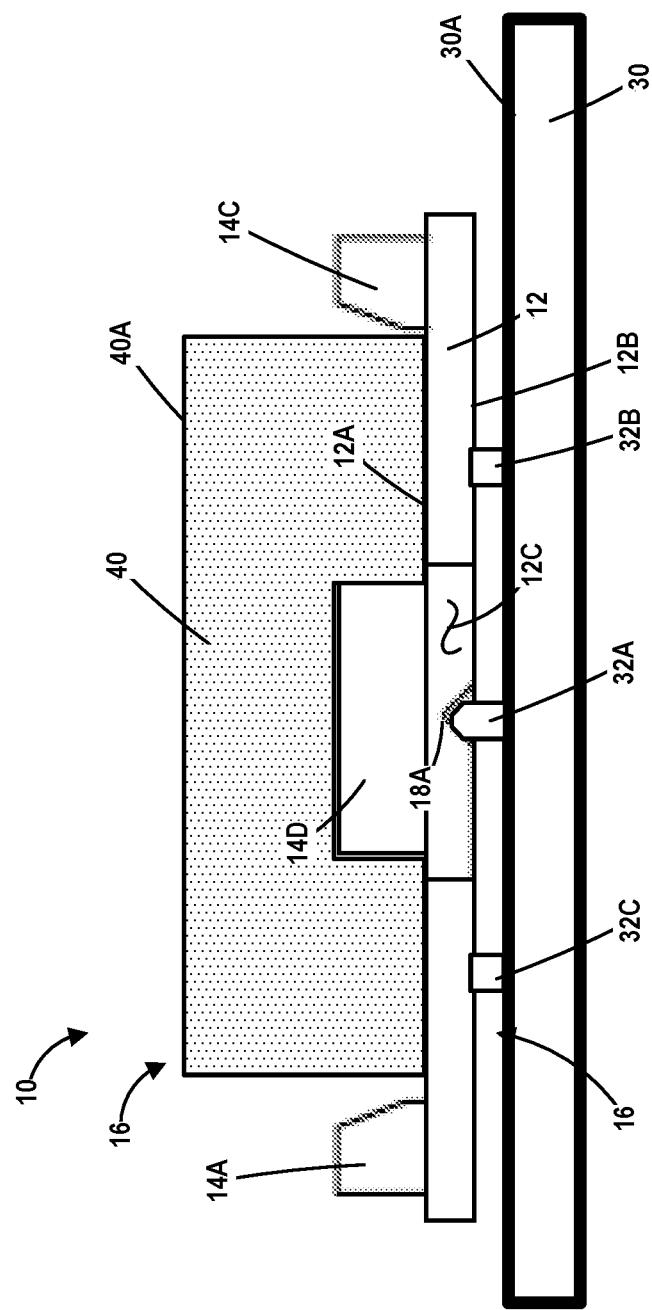
FIG. 19 is a front view of the device shown in FIG. 18.

FIG. 19 is a front view of the device shown in FIG. 18. The vertical height of the reticle pod 40 relative to the vertical height of the reticle pod receiving guides 14 may vary depending upon the particular application, i.e., the vertical height of the reticle pod 40 may be less than, greater than or substantially the same as the vertical height of the reticle pod receiving guides 14. In the example depicted in FIG. 19, the vertical height of the reticle pod 40 is greater than the vertical height of the reticle pod receiving guides 14.

Figure 20:
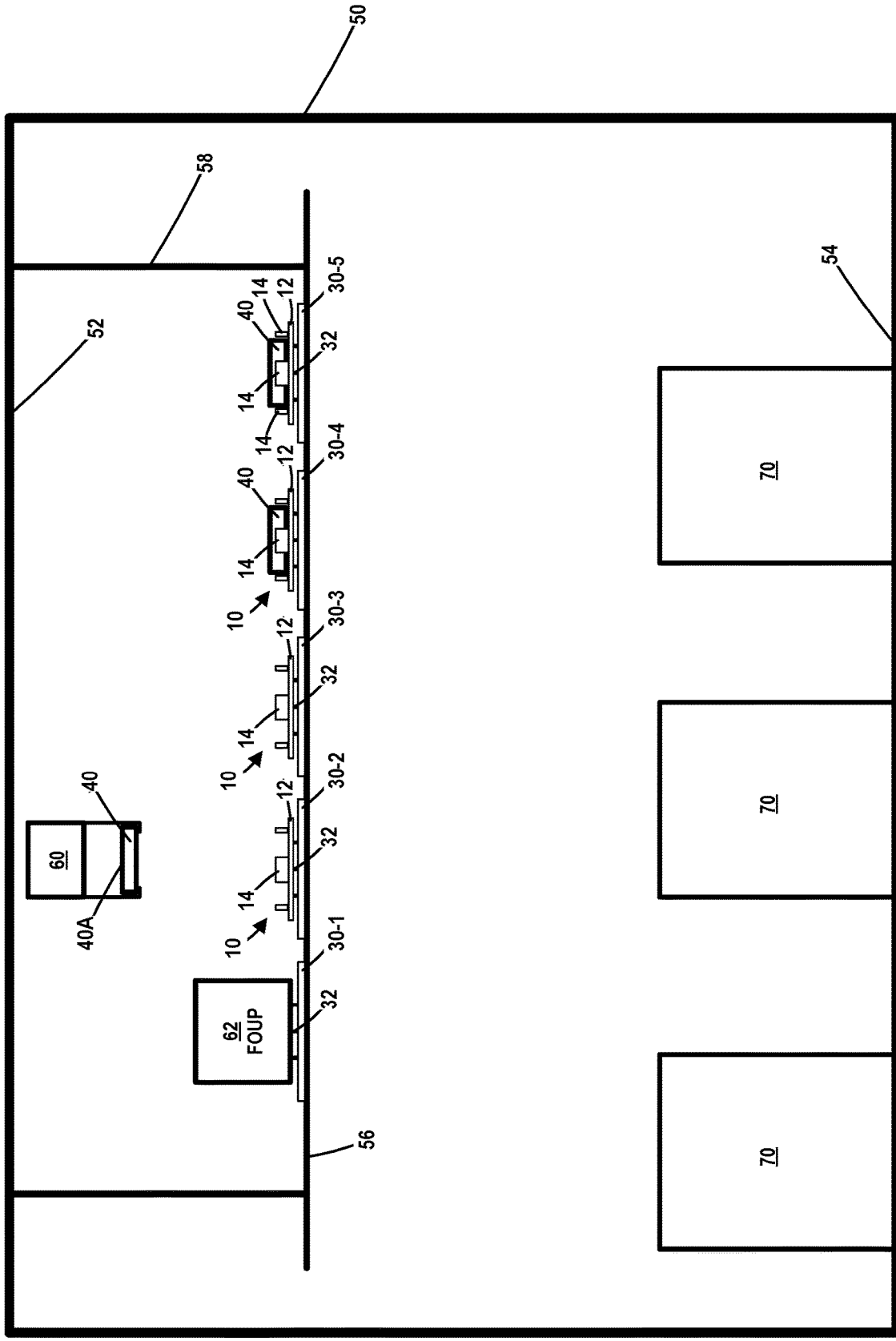
FIG. 20 depicts one illustrative reticle pod storage system disclosed herein that may employ the novel conversion plates for reticle pod storage disclosed herein.

FIG. 20 depicts one illustrative reticle pod storage system disclosed herein that may employ the novel conversion plates 10 for reticle pod storage disclosed herein. FIG. 20 shows a simplistically depicted clean room 50 with a ceiling 52 and a floor 54. A plurality of simplistically depicted processing tools 70 that are positioned within the clean room 50 are also shown in FIG. 20. An illustrative storage shelf 56, commonly used in Zero Footprint Storage systems, is suspended from the ceiling 52 by illustrative supports 58. The storage shelf 56 may also be secured to the walls of the clean room 50 or to other structures. A simplistically depicted overhead crane system 60 is also shown in FIG. 20. The crane system 60 is adapted to grasp and receive a FOUP 62 and/or a reticle pod 40 positioned on a transport vehicle (not shown) that typically travels throughout the clean room on a ceiling based track system (not shown) and position the received FOUP 62 or reticle pod 40 at a desired location on the storage shelf 56. The structure, function, control and operation of such a crane system 60 are well known to those skilled in the art.

A plurality of individual FOUP storage bins 30 are positioned or formed on the storage shelf 56. For ease of reference, a suffix 1-5 has been added to the reference number 30 for the FOUP storage bins 30, e.g., 30-3. Each of the FOUP storage bins 30 comprises the above-described SEMI standard load port pins 32. In practice, the plurality of individual FOUP storage bins 30 may be replaced with a relatively long plate wherein five sets of the SEMI standard load port pins 32 are spaced apart of the long plate.

In one illustrative embodiment, a conversion plate 10 is manually positioned on the SEMI standard load port pins 32 of any desired number of the FOUP storage bins 30. In the example shown in FIG. 20, a conversion plate 10 has been positioned on the FOUP storage bins 30-2, 30-3, 30-4 and 30-5. As depicted, a conversion plate 10 was not positioned on the FOUP storage bin 30-1. The illustrative FOUP 62 is positioned on the SEMI standard load port pins 32 on the FOUP storage bin 30-1. As indicated, the crane system 60 has previously been used to lift, transport and lower a reticle pod 40 into the reticle pod receiving area 16 in the conversion plate 10 positioned on the FOUP storage bins 30-4 and 30-5. The reticle pod receiving area 16 of the conversion plates 10 on the FOUP storage bins 30-2 and 30-3 are empty. The crane system 60 is depicted as being in the process of transporting a reticle pod 40 to the reticle pod receiving area 16 of the conversion plates 10 on one of the FOUP storage bins 30-2 or 30-3. As the reticle pod 40 is being lowered toward the reticle pod receiving area 16, if there is any misalignment between the positioning of the reticle pod 40 and the reticle pod receiving area 16, the reticle pod 40 may engage the tapered surface 14F on one or more of the reticle pod receiving guides 14 so as to properly align the reticle pod 40 with the reticle pod receiving area 16. Of course, as noted above, the reticle pods 40 in FIG. 20 may or may not contain a reticle 42.

In the example shown in FIG. 20, the system is adapted to store both FOUPs 62 and reticle pods 40. However, in some applications, the system may be dedicated to storing only reticle pods 40. Importantly, by use of the novel conversion plates 10, systems and methods disclosed herein, reticle pods 40 may be stored on the overhead storage shelf 56, thereby reducing the use of valuable clean floor space for the storage of reticle pods 40.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
   a plate, the plate having a front surface and a back surface, the back surface being positioned opposite the front surface; and
   a reticle pod receiving structure on the front surface, the reticle pod receiving structure at least partially bounding a reticle pod receiving area on the front surface, the back surface having a pin engagement structure, the pin engagement structure being adapted to engage a plurality of pins, wherein the pin engagement structure comprises a plurality of channels including a first channel, a second channel and a third channel, wherein the plate has at least a first edge surface, a second edge surface and a third edge surface, and wherein the first channel intersects the first edge surface, the second channel intersects the second edge surface and the third channel intersects the third edge surface.

2. The device of claim 1, wherein the reticle pod receiving structure comprises a plurality of individual reticle pod receiving guides.

3. The device of claim 2, wherein each of the plurality of individual reticle pod receiving guides is removably coupled to the front surface.

4. The device of claim 3, wherein each of the plurality of individual reticle pod receiving guides comprises an outwardly tapered surface, and each of the plurality of individual reticle pod receiving guides is positioned on the front surface such that the outwardly tapered surface faces toward the reticle pod receiving area.

5. The device of claim 3, wherein the plurality of individual reticle pod receiving guides comprises four individual reticle pod receiving guides.

6. The device of claim 1, wherein each of the plurality of channels is adapted to engage one of the plurality of pins.

7. The device of claim 1, wherein the pin engagement structure is adapted to engage three SEMI standard load port pins.

8. The device of claim 1, wherein each of the plurality of channels is positioned entirely within the plate.

9. The device of claim 1, wherein the plurality of channels comprises a first channel having a first long axis, a second channel having a second long axis and a third channel having a third long axis, wherein an extension of the first long axis, an extension of the second long axis and an extension of the third long axis intersect one another at a point below the reticle pod receiving area and wherein, when viewed from above, the radial spacing between the first channel and the second channel is approximately 120 degrees, the radial spacing between the second channel and the third channel is approximately 120 degrees, and the radial spacing between the third channel and the first channel is approximately 120 degrees.

10. The device of claim 1, wherein the plurality of channels do not physically intersect one another.

11. A device comprising:
- a plate, the plate having a front surface, a back surface, a first edge surface, a second edge surface and a third edge surface, the back surface being positioned opposite the front surface; and
- a plurality of individual reticle pod receiving guides, wherein the plurality of individual reticle pod receiving guides at least partially bound a reticle pod receiving area on the front surface, the back surface having a first channel, a second channel and a third channel, wherein each of the first channel, the second channel and the third channel is adapted to engage a SEMI standard load port pin and wherein the first channel intersects the first edge surface, the second channel intersects the second edge surface and the third channel intersects the third edge surface.

12. The device of claim 11, wherein each of the plurality of individual reticle pod receiving guides comprises an outwardly tapered surface, and each of the plurality of individual reticle pod receiving guides is positioned on the front surface such that the outwardly tapered surface faces toward the reticle pod receiving area.

13. The device of claim 11, wherein the plurality of individual reticle pod receiving guides comprises four individual reticle pod receiving guides.

14. The device of claim 11, wherein the first channel has a first long axis, the second channel has a second long axis and the third channel has a third long axis, wherein an extension of the first long axis, an extension of the second long axis and an extension of the third long axis intersect one another at a point below the reticle pod receiving area and wherein, when viewed from above, the radial spacing between the first channel and the second channel is approximately 120 degrees, the redial spacing between the second channel and the third channel is approximately 120 degrees, and the radial spacing between the third channel and the first channel is approximately 120 degrees.

* * * * *

UNITED STATES PATENT AND TRADEMARK OFFICE
CERTIFICATE OF CORRECTION

PATENT NO. : 11,658,053 B2
APPLICATION NO. : 16/659090
DATED : May 23, 2023
INVENTOR(S) : Michael Raga-Barone It is certified that error appears in the above-identified patent and that said Letters Patent is hereby corrected as shown below:

In the Specification

Column 2, Line 15, the second full paragraph reads:
Yet another illustrative device disclosed herein means positioned on a first surface of the FOUP storage bin for registering with a FOUP and a conversion plate. In this example, the conversion plate comprises a plate having a front surface includes a plate having a front surface, a back surface, a first edge surface, a second edge surface and a third edge surface. In this example, the device also includes a plurality of individual reticle pod receiving guides that at least partially bound a reticle pod receiving area on the front surface, and the back surface has a first channel, a second channel and a third channel, wherein each of the first channel, the second channel and the third channel is adapted to engage a SEMI standard load port pin and wherein the first channel intersects the first edge surface, the second channel intersects the second edge surface and the third channel intersects the third edge surface.

Should read:
Yet another illustrative device disclosed herein includes a plate having a front surface, a back surface, a first edge surface, a second edge surface and a third edge surface. In this example, the device also includes a plurality of individual reticle pod receiving guides that at least partially bound a reticle pod receiving area on the front surface, and the back surface has a first channel, a second channel and a third channel, wherein each of the first channel, the second channel and the third channel is adapted to engage a SEMI standard load port pin and wherein the first channel intersects the first edge surface, the second channel intersects the second edge surface and the third channel intersects the third edge surface.

Signed and Sealed this
Fourth Day of July, 2023

Katherine Kelly Vidal
*Director of the United States Patent and Trademark Office*